(12) United States Patent
Stephens et al.

(10) Patent No.: US 11,043,418 B2
(45) Date of Patent: Jun. 22, 2021

(54) MIDDLE OF THE LINE SELF-ALIGNED DIRECT PATTERN CONTACTS

(71) Applicant: GLOBALFOUNDRIES U.S. INC., Santa Clara, CA (US)

(72) Inventors: Jason E. Stephens, Menands, NY (US); Daniel Chanemougame, Niskayuna, NY (US); Ruilong Xie, Niskayuna, NY (US); Lars W. Liebmann, Mechanicville, NY (US); Gregory A. Northrop, Ballston Spa, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/685,648

(22) Filed: Nov. 15, 2019

(65) Prior Publication Data

US 2020/0083102 A1    Mar. 12, 2020

Related U.S. Application Data

(62) Division of application No. 15/868,479, filed on Jan. 11, 2018, now Pat. No. 10,522,403.

(51) Int. Cl.
*H01L 21/768* (2006.01)
*H01L 23/528* (2006.01)
*H01L 23/522* (2006.01)

(52) U.S. Cl.
CPC .. *H01L 21/76897* (2013.01); *H01L 21/76802* (2013.01); *H01L 21/76885* (2013.01); *H01L 23/528* (2013.01); *H01L 23/5226* (2013.01); *H01L 21/7682* (2013.01); *H01L 21/76849* (2013.01)

(58) Field of Classification Search
CPC ........... H01L 23/5226; H01L 21/76877; H01L 23/528
See application file for complete search history.

(56) References Cited

U.S. PATENT DOCUMENTS

| | | |
|---|---|---|
| 4,502,210 A | 3/1985 | Okumura et al. |
| 5,780,337 A | 7/1998 | Huang |
| 9,337,105 B1* | 5/2016 | Kwon ................. H01L 21/0228 |
| 9,711,421 B1* | 7/2017 | Lam ................... H01L 29/41725 |
| 2004/0097013 A1* | 5/2004 | Lur ..................... H01L 23/5222 |
| | | 438/118 |

(Continued)

OTHER PUBLICATIONS

Taiwanese Office Action and Search Report in related TW Application No. 107119850 dated Sep. 2, 2019, 14 pages.

*Primary Examiner* — John A Bodnar
(74) *Attorney, Agent, or Firm* — Anthony Canale; Andrew M. Calderon; Roberts Calderon Safran & Cole P.C.

(57) ABSTRACT

The present disclosure relates to semiconductor structures and, more particularly, to middle of the line self-aligned direct pattern contacts and methods of manufacture. The structures described herein include: at least one gate structure with a metallization and source/drain regions; a source/drain contact in electrical connection with the source/drain regions, respectively; and a contact structure with a re-entrant profile in electrical connection with the source/drain contact and the metallization of the at least one gate structure, respectively.

19 Claims, 7 Drawing Sheets

(56) References Cited

U.S. PATENT DOCUMENTS

| | | | |
|---|---|---|---|
| 2006/0019456 A1* | 1/2006 | Bu | H01L 29/7843 |
| | | | 438/303 |
| 2009/0101943 A1 | 4/2009 | Miyashita | |
| 2009/0130842 A1* | 5/2009 | Hwang | H01L 27/10814 |
| | | | 438/637 |
| 2010/0136781 A1* | 6/2010 | Kulkarni | H01L 23/528 |
| | | | 438/622 |
| 2010/0264550 A1 | 10/2010 | Yang | |
| 2015/0076708 A1 | 3/2015 | Kaneko et al. | |

\* cited by examiner

MIDDLE OF THE LINE SELF-ALIGNED DIRECT PATTERN CONTACTS

FIELD OF THE INVENTION

The present disclosure relates to semiconductor structures and, more particularly, to middle of the line self-aligned direct pattern contacts and methods of manufacture.

BACKGROUND

Back end of the line (BEOL) and middle of the line (MOL) metallization is becoming more challenging in advanced technology nodes due to the critical dimension (CD) scaling and process capabilities. For example, as technology advances in designing integrated circuit (IC) chips, the IC chips are required to become smaller and smaller which, in turn, raises problems of contact shorting with gate structures as one example. More specifically, in such scaled structures, shorts are likely to occur between the contacts of the drain/source regions and the metallization of the gate structure, itself.

By way of example, shorting between the contacts of the drain/source regions and the metallization of the gate structure can occur due to overlay or misalignment issues in the masking step of the patterning processes. As another example, the etching processes for forming the interconnect (contact) to the drain and/or source contacts can corrode the sidewalls of the gate structures, exposing the metallization of the gate structure, itself. In subsequent metallization processes, the metal material for forming the contact structure can then electrically contact the metallization of the gate structure, resulting in a short.

Other issues with scaling of the devices include, e.g., metallization to the source and drain contacts or other metallization, requires tip-to-tip configurations at a contact space equivalent to one contacted poly pitch (cpp). This requires metal extensions past the contact to maintain yield; however, such extensions hurt scaling and add extra parasitic capacitance due to an extra wire run. In addition, as a potential alternative, super via structure integration is very difficult, requiring extra fabrication processes, potentially also hurting scaling. As to the latter point, the super via structure requires a large cross-section of the via (opening) to ensure that metal material can adequately fill the super via structure without the formation of airgaps, which can significantly affect parasitic capacitance and resistance due to the extra needed metal material.

SUMMARY

In an aspect of the disclosure, a structure comprises: at least one gate structure with a metallization and source/drain regions; a source/drain contact in electrical connection with the source/drain regions, respectively; and a contact structure with a re-entrant profile in electrical connection with the source/drain contact and the metallization of the at least one gate structure.

In an aspect of the disclosure, a structure comprises: a plurality of gate structures each of which comprises a metallization and source/drain regions; a plurality of source/drain contacts in electrical connection with the source/drain regions of the plurality of gate structures; a first set of contact structures with a re-entrant profile in electrical connection with selected source/drain contacts of the plurality of source/drain contacts; a second set of contact structures with a re-entrant profile in electrical connection with the metallization of selected gate structures of the plurality of gate structures; and metal wiring features in electrical connection with sidewalls of selected ones of the first set and second set of the plurality of contact structures.

In an aspect of the disclosure, a method comprises: forming a plurality of gate structures each of which comprise a metallization and source/drain regions; forming a plurality of source/drain contacts in electrical connection with the source/drain regions of the plurality of gate structures; and forming, with a single metallization, a set of contact structures with a re-entrant profile in electrical connection with selected source/drain contacts of the plurality of source/drain contacts and the metallization of selected gate structures of the plurality of gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
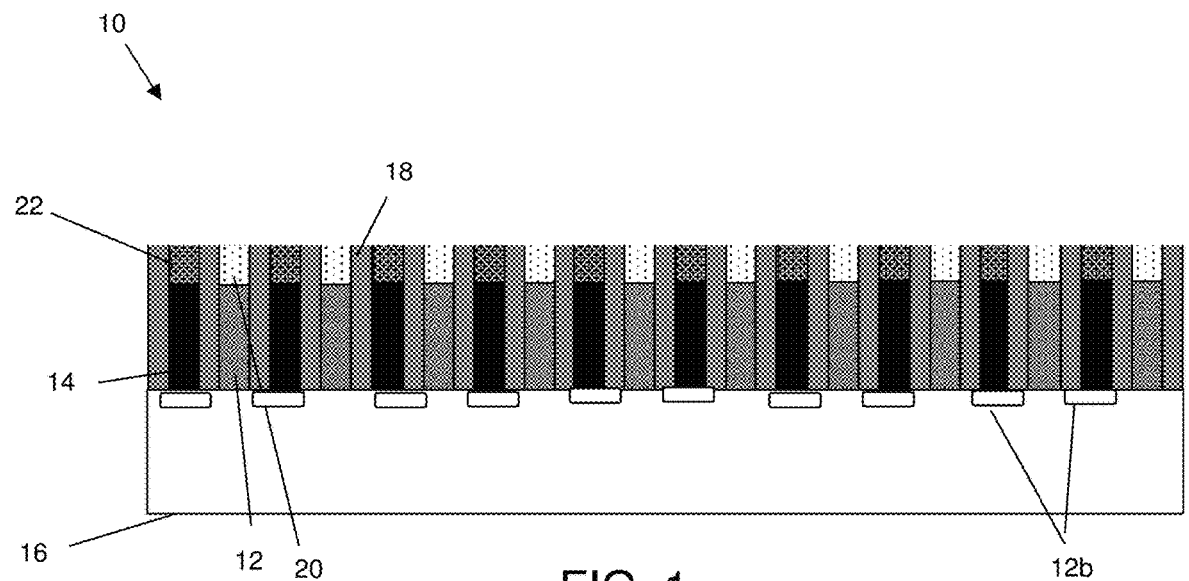
FIG. 1 shows middle of the line (MOL) structures and respective fabrication processes in accordance with aspects of the present disclosure.

The present disclosure relates to semiconductor structures and, more particularly, to middle of the line (MOL) self-aligned direct pattern contacts and methods of manufacture. More specifically, the present disclosure relates to MOL self-aligned direct pattern contacts with an integration scheme having a single metal layer contact plane. Advantageously, in embodiments, the integration scheme enables super vias and multi-purpose constructs, e.g., contacts, interconnects, etc., without negatively impacting resistance or capacitance of the wiring structures, e.g., metal wiring contacts and interconnect structures and without hurting the scaling In embodiments, the integration schemes disclosed herein enable re-entrant profiles for MOL contacts which will not compromise metal fill and resistance, while also providing more robust integration for yield vs. process variations (compared to conventional processes). The re-entrant profiles of the contacts will also not affect IC scaling. In addition, the integration schemes disclosed herein enable metal to via negative enclosures. Advantageously, the metal to via negative enclosures will not compromise contact resistance or yield or impact scaling, while also relaxing tip-to-tip requirements. The metal to via negative enclosures will also provide an optimum solution for parasitic capacitance reduction without the need for extra wire runs.

In addition, the integration schemes disclosed herein will enable super via-like structure integration which avoids the use of small metal islands, which in turns avoids tight tip-to-tip situations, does not compromise metal fill and resistance, and also reduces intra-cell metal level usage on a first metal layer. The super via-like structure integration schemes also allow a quick escape path to an upper metal layer, with limited RC impact. In addition, the integration schemes disclosed herein enable interconnect level to connect to gate contacts (PC) or silicide contacts (TS) from opposite sides in a tip-to-tip configuration for contact spacing as small as one contacted poly pitch (cpp).

In more specific embodiments, the structures described herein include one single metal level to achieve MOL interconnect structures. The local interconnect structures and/or contacts can have re-entrant profiles. An encapsulation layer (capping material) allows the contacts (interconnect structures) to be larger than the device terminal without shorting to the adjacent device terminal. The contacts and/or interconnect structures (connecting on a single wiring plane) are also tall enough so the top surface directly connects to the next level contact or via, i.e., the contacts can extend from the source/drain contacts to a next level wiring layer. In addition, the interconnect integration scheme forms a sidewall connection (in a single wiring plane) to the next level contact or via (on a single wiring plane) to ensure adequate connectivity despite partial overlap and process variations. In addition, the partial overlap allows two runs of the interconnect to connect to device terminals from opposite sides in a tip-to-tip configuration for contact spacing as small as one contacted poly pitch (cpp). In additional embodiments, the interconnect structures and/or contacts for different device terminals can be metalized together, while the interconnect level that connects to the contacts is provided in a lateral orientation such that the interconnect level can be in the same plane as the contacts.

FIG. 1 shows MOL structures and respective fabrication processes in accordance with aspects of the present disclosure. In particular, the MOL structure 10 includes a plurality of gate structures 12 and contacts (e.g., source and drain contacts) 14, each of which are formed on a substrate 16. In embodiments, the gate structures 12 can be replacement metal gate structures fabricated using replacement metal gate processes, as is known in the art. In a non-limiting illustrative example, the gate structures 12 can include any appropriate workfunction metal deposited on a high-k gate dielectric material. In embodiments, the high-k dielectric gate material can be hafnium based dielectrics, as an example. In further examples, the high-k dielectrics include, but are not limited: $Al_2O_3$, $Ta_2O_3$, $TiO_2$, $La_2O_3$, $SrTiO_3$, $LaA_1O_3$, $ZrO_2$, $Y_2O_3$, $Gd_2O_3$, and combinations including multilayers thereof.

The contacts 14 can be, for example, tungsten material, formed on silicide regions of the source and drain regions 12b of the gate structures 12. As the formation of silicide regions are well known by those of skill in the art, no further explanation is required to describe the processes in order for an ordinarily skilled person in the art to practice the invention without undue experimentation. In embodiments, a liner or barrier can be deposited prior to the deposition of the material for the contacts 14.

Still referring to FIG. 1, the gate structures 12 and contacts 14 are separated from one another by spacers 18. The spacers 18 can be fabricated from any spacer material, e.g., nitride, using conventional deposition and etching processes. For example, spacer material can be deposited on the sidewalls of dummy gate structures, followed by a directional etching process, e.g., anisotropic etching process. Both the gate structures 12 and the contacts 14 include capping material (encapsulation layer) 20, 22, respectively, deposited on a top surface thereof. In embodiments, the capping material 20 on the gate structures 12 and the capping material 22 on the contacts 14 can be different materials. For example, the capping material 20 on the gate structures 12 can be a nitride material; whereas, the capping material 22 on the contacts 14 can be an oxide material, although this is not a limiting feature. As should be understood, the capping material will prevent shorts from occurring during subsequent contact formation processes.

As should now be understood by those of ordinary skill in the art, the structures shown in FIG. 1 (and other structures herein) can be manufactured in a number of ways using a number of different tools. In general, though, the methodologies and tools are used to form structures with dimensions in the micrometer and nanometer scale. The methodologies, i.e., technologies, employed to manufacture the structures of FIG. 1 are built on wafers and are realized in films of material patterned by photolithographic processes. In particular, the fabrication of the structures of FIG. 1 use three basic building blocks: (i) deposition of thin films of material on a substrate, (ii) applying a patterned mask on top of the films by photolithographic imaging, and (iii) etching the films selectively to the mask.

Figure 2:
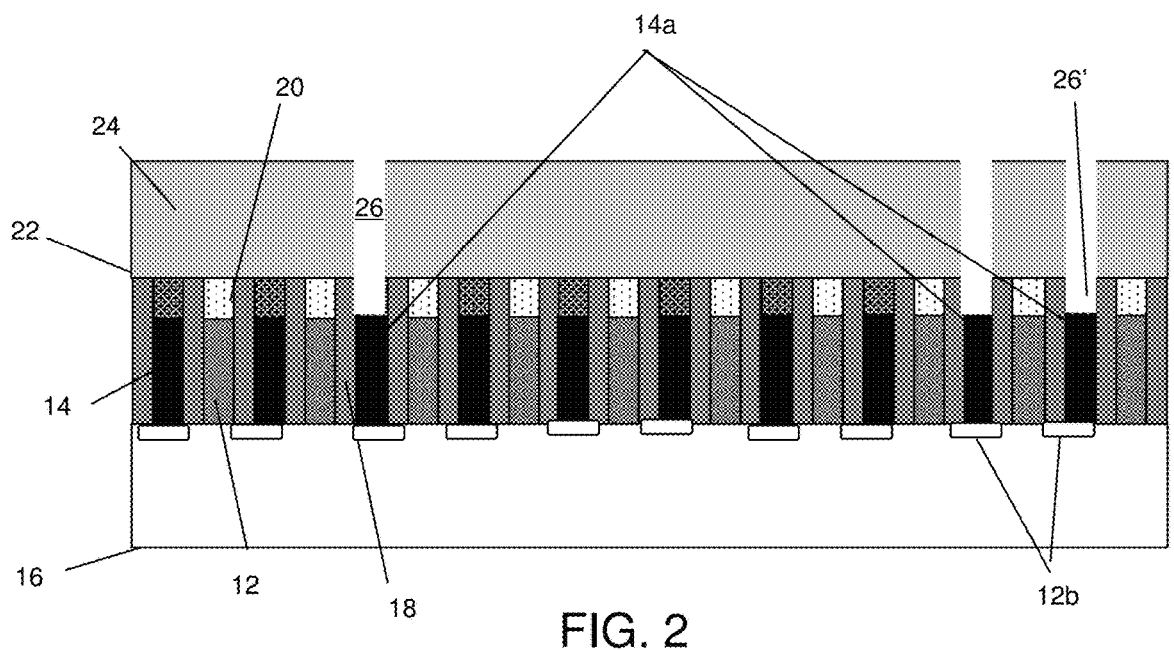
FIG. 2 shows recessed areas over selected source/drain contact regions, amongst other features, and respective fabrication processes in accordance with aspects of the present disclosure.

FIG. 2 shows a planarized material 24 formed over the structure of FIG. 1. In particular, the planarized material 24 includes, e.g., organic planarization layer (OPL), formed over the capping materials 20, 22 and spacers 18 of FIG. 1. The planarized material 24 is subject to lithographic and etching processes to form openings 26 aligned with selected contacts 14a.

Still referring to FIG. 2, in embodiments, an etching process with a selective chemistry, e.g., RIE, will be used to remove the capping material 22 over the selected contacts 14a, thereby forming recessed areas 26'. The recessed areas 26' will form a contact opening, exposing the material of the selected contacts 14a. Note that any overlay issues of the opening 26, leading to partial exposition of the gate, will not result in the erosion or removal of the capping material 20 of the gate structure 12 during the etching processes. This is due to the different capping materials used for the gate structures 12 and the contacts 14. The resist and the planarized material 24 can then be removed by conventional stripping processes.

Figure 3:
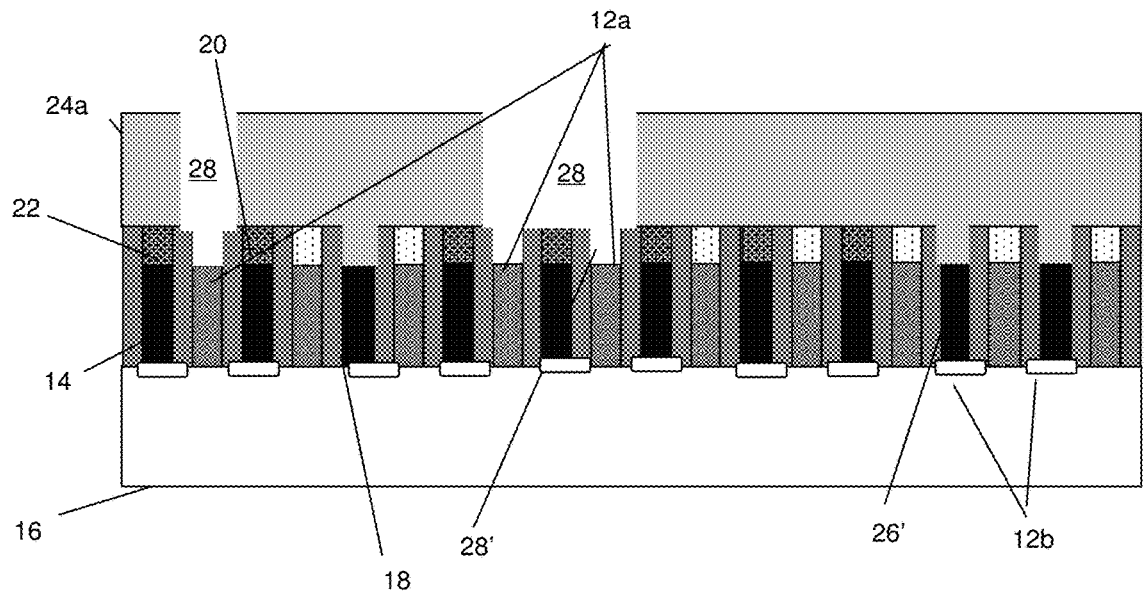
FIG. 3 shows recessed areas over selected gate structures, amongst other features, and respective fabrication processes in accordance with aspects of the present disclosure.

In FIG. 3, another planarized material 24a, e.g., organic planarization layer (OPL), is formed over the capping materials 20, 22, spacers 18 and within the recessed areas 26'. The planarized material 24a is then subject to lithographic and etching processes to form openings 28 aligned with selected gates 12a, in a similar manner as noted with respect to FIG. 2. An etching process with a selective chemistry, e.g., RIE, will be used to remove the capping material 20 over the selected gate structures 12a, thereby forming recessed areas 28', e.g., contact openings exposing the gate material of the selected gate structures 12a. Again, any overlay issues of the opening 28 will not result in the erosion or removal of the capping material 22 of the contacts 14 due to the different capping materials used for the gate structures 12 and the contacts 14. The resist and the planarized material 24a can then be removed by conventional stripping processes.

Figure 4:
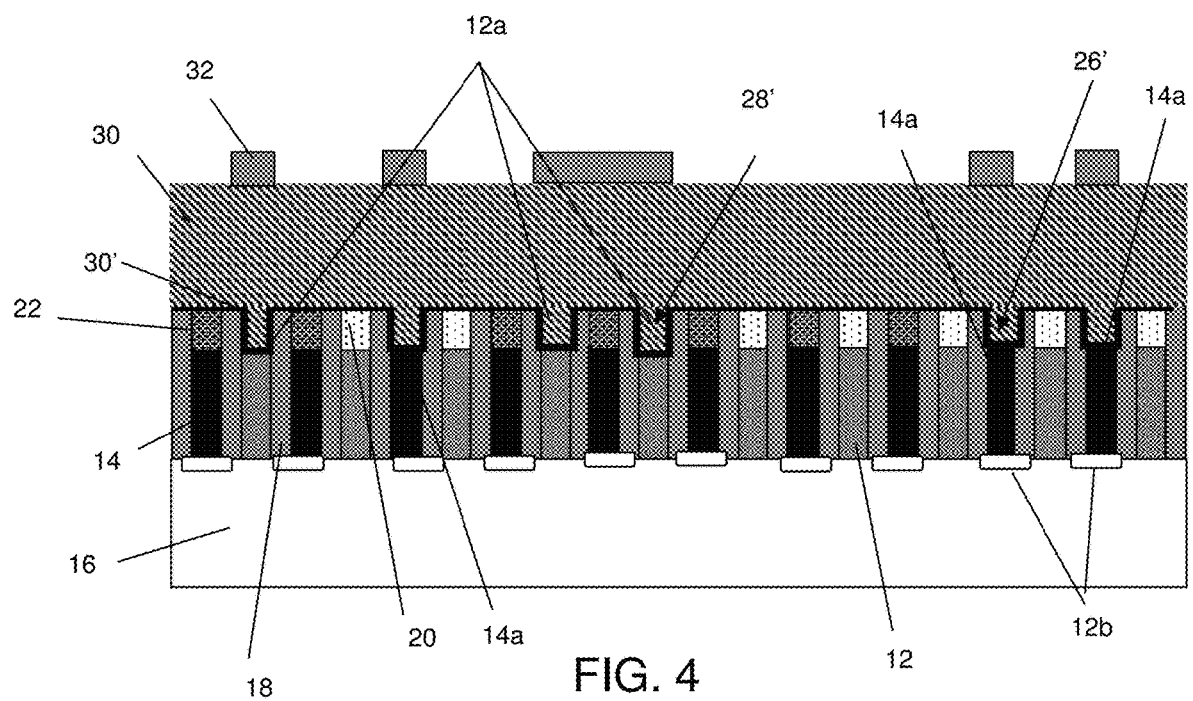
FIG. 4 shows metallization in the recessed areas of the selected source/drain regions and gate structures, amongst other features, and respective fabrication processes in accordance with aspects of the present disclosure.

FIG. 4 shows a deposition of metal material 30 over the gate structures 12 and contacts 14. More specifically, the metal material is deposited within the recessed areas 26' and 28', e.g., contact openings for the selected source/drain contacts 14a and gate structures 12a, respectively. In this way, a metallization layer can be formed in direct contact with the selected contacts 14a and gate structures 12a in a single deposition process. Accordingly, as should be understood by those of ordinary skill in the art, by providing a single metal material 30, contacts for different device terminals (e.g., source/drain and metal gate structures) can be metallized together.

In embodiments, the metal material 30 can be cobalt which is deposited using a blanket deposition process, e.g., chemical vapor deposition (CVD); although other metal materials can also be used, e.g., ruthenium, etc. The depth (height) of the metal material 30 can be deposited to enable contacts or interconnect structures at the first level to be tall enough so the top surface of the contacts and/or interconnect structures directly connect to the next level contact or via. For example, the metal material 30 can be deposited to a depth of about 50 nm to about 60 nm; although other dimensions are contemplated herein.

It is also contemplated that a liner and/or barrier (represented by reference numeral 30') can be deposited prior to the blanket deposition of the metal material 30. The liner and/or barrier 30' can be, e.g., TaN or Co, for example, deposited by a conventional deposition process, e.g., CVD. In embodiments, the liner and/or barrier 30' will be deposited directly on the exposed conductive material of the selected contacts 14a and gate structures 12a, prior to the blanket deposition process of the metal material 30. As a blanket deposition process is utilized (compared to conventional trench metallization processes), the liner and/or barrier 30' can be deposited directly on the, e.g., exposed portions of the selected contacts 14a and gate structures 12a. Beneficially, by implementing such integration scheme, in subsequent metal patterning processes, e.g., see FIG. 5, the metal material 30 can be directly patterned (etched) without interference from liner/barrier material, which is deposited on sidewalls of a trench in conventional trench metallization processes. In this way, in the interconnects and/or contacts for source/drain contacts and other metallization features such as a wiring level can be patterned with some interfaces removed, e.g., from contact metals to contact liner and contact liner to different metal layers, respectively.

Figure 10:
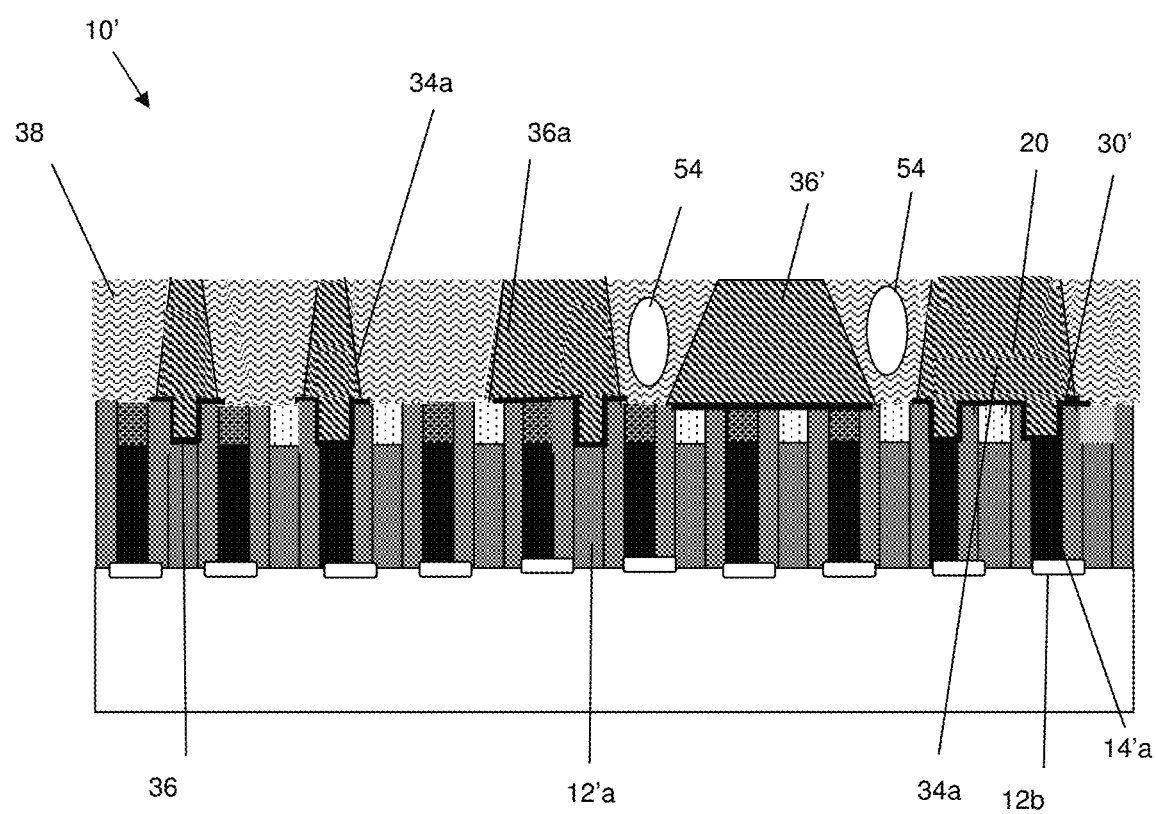
FIG. 10 shows different configurations/arrangements with the re-entrant profile contacts and airgaps, amongst other features, and respective fabrication processes in accordance with additional aspects of the present disclosure.

Still referring to FIG. 4, the metal material 30 will be polished and/or planarized using conventional polishing processes, e.g., chemical mechanical polishing (CMP). Following the planarization process, a single hardmask material 32 can be deposited and patterned using conventional deposition and patterning processes, as is known to those of skill in the art. In embodiments, the hardmask material 32 will be patterned with the selected contacts 14a and gate structures 12a in order to form metallization structures, e.g., contacts and/or interconnect structures on a single level. In embodiments, although it is shown that the hardmask material 32 is patterned with selected contacts 14a and gate structures 12a, for such pattern to be transferred in subsequent processes, the hardmask 32 can additionally be patterned with a metal layer, e.g., MO pattern (see, e.g., reference numerals 42a, 42b, 42c) of FIG. 7, as shown in FIG. 10.

Figure 5:
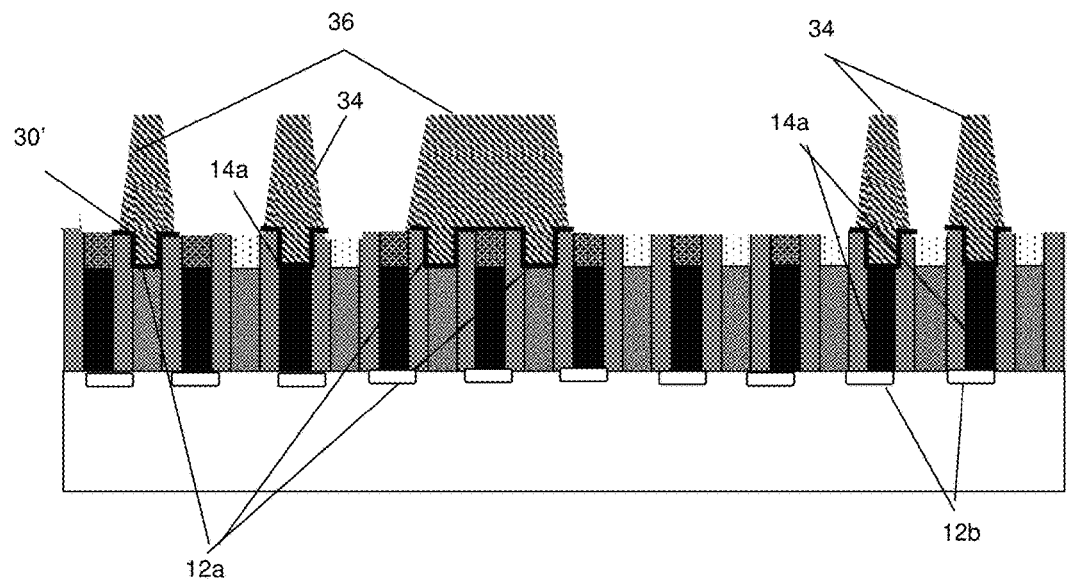
FIG. 5 shows contacts with re-entrant profiles, e.g., patterning of the metallization, amongst other features, and respective fabrication processes in accordance with aspects of the present disclosure.

In FIG. 5, using the single patterned hardmask material 32, the metal material 30 is patterned using RIE processes to form interconnect structures (e.g., contacts) 34, 36. As should be understood by those of skill in the art, the contacts 34 are formed by a direct metal pattern transfer in direct electrical contact with the contacts 14a for source/drain regions; whereas, the contacts 36 are formed by a direct metal pattern transfer in direct electrical contact with the gate structures 12a. Advantageously, by using the blanket deposition process followed by the direct metal patterning process, any metallization issues that would have been developed in a conventional integration with conventional profiles will now be eliminated.

As shown in FIG. 5, the contacts 34, 36 will have re-entrant profiles, e.g., reverse tapered profiles, with the larger dimension in direct contact with the respective gate structures 12a and the source/drain contacts 14a. The encapsulation layer (capping material) allows the contacts 34, 36 to be larger than the device terminal (e.g., gate structures 12 and source/drain contacts 14) without shorting to the adjacent device terminal. Also, by virtue of the re-entrant profiles, the larger bottom portion of the contacts 34, 36 provides an extra margin for overlay errors/misalignment. In addition, the contacts 34, 36 will have a smaller profile at a top portion thereof, which allows for improved scaling of the circuit.

The re-entrant profiles of the contacts 34, 36 will also provide more robust integration for yield vs. process variations. That is, for example, the re-entrant profiles of the contacts 34, 36 will permit the interconnect level to connect to gate contacts (PC) and/or silicide contacts (TS) from opposite sides in a tip-to-tip configuration for contact spacing as small as one contacted poly pitch (cpp). After the patterning, the hardmask can be removed by conventional stripping processes.

Figure 6:
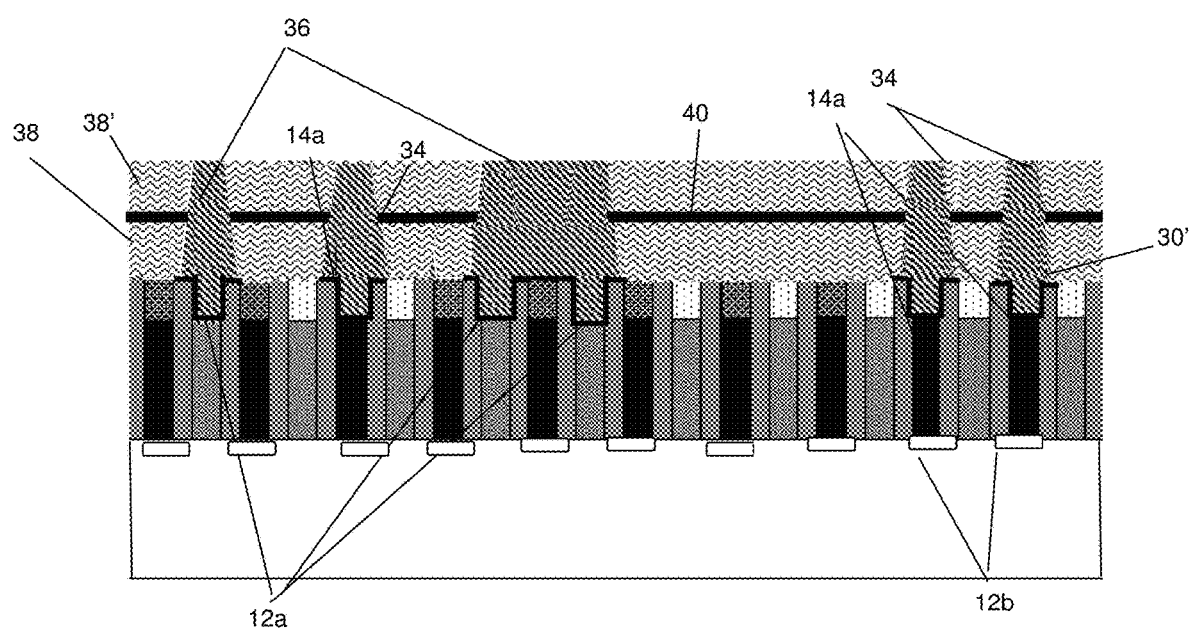
FIG. 6 shows interlevel dielectric material about the contacts, amongst other features, and respective fabrication processes in accordance with aspects of the present disclosure.

In FIG. 6, an interlevel dielectric material 38, 38' and an etch block material 40 is deposited over the contacts 34, 36. In embodiments, the interlevel dielectric material 38, 38' and the etch block material 40 can be deposited using conventional deposition processes, e.g., CVD, and then polished or etched back. The interlevel dielectric material 38, 38' can be an ultra-low-k dielectric material and the etch block material 40 can be any appropriate blocking material, e.g., NBLOK (nitrogen based blocking material).

Figure 7:
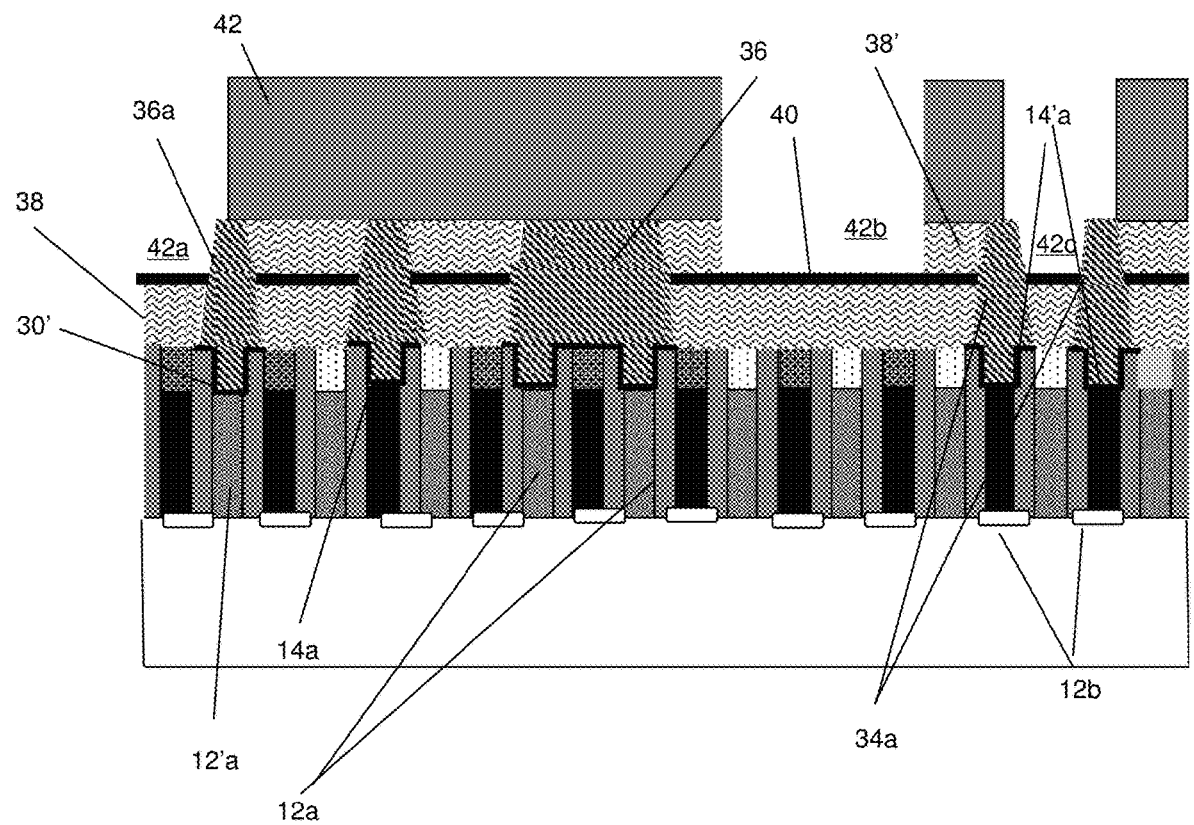
FIG. 7 shows openings in an upper layer of interlevel dielectric material, amongst other features, and respective fabrication processes in accordance with aspects of the present disclosure.

As shown in FIG. 7, a lithographic stack 42 is formed on the upper interlevel dielectric material 38'. The lithographic stack 42 includes a photoresist material, for example, which is exposed to energy to form a pattern. The pattern is then transferred to the upper interlevel dielectric material 38' by a conventional etching process to form openings 42a, 42b, 42c. As should be understood by those of skill in the art, the etch block material 40 will prevent etching of the lower interlevel dielectric material 38. In embodiments, the openings 42a, 42b, 42c will expose sidewalls of the selected contacts 36a of selected gate structures 12'a and contacts 34a of selected source/drain contacts 14'a. The lithographic stack 42 can then be removed by conventional etching and stripping processes.

Figure 8:
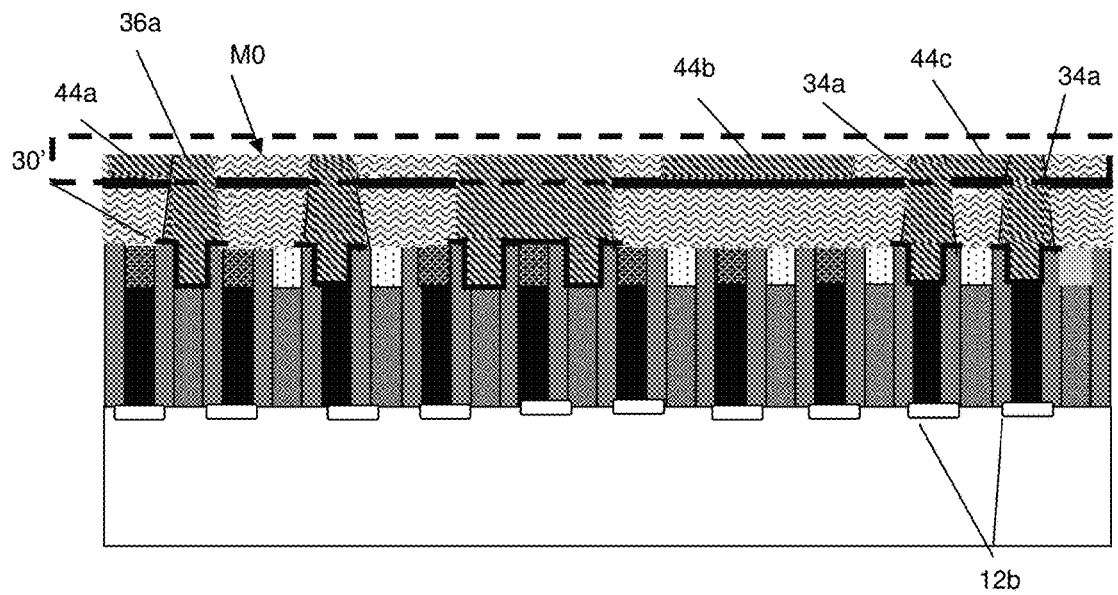
FIG. 8 shows metal wiring structures in the openings of the upper level interlevel dielectric material, amongst other features, and respective fabrication processes in accordance with aspects of the present disclosure.

In FIG. 8, a metal material is deposited within the openings 42a, 42b, 42c of the upper interlevel dielectric material 38', followed by a planarization process, e.g., CMP. The deposition and planarization process will form wiring structures 44a, 44b, 44c in direct contact with the exposed sidewalls of the selected contacts 34a, 36a. It should be recognized that the wiring structures 44a, 44b, 44c will be on a same plane, and will comprise a first wiring layer, e.g., MO, that is separated from the source/drain and the gate metallization by at least the etch block material 40 and interlevel dielectric material 38. It should also be understood that as in any of the embodiments described herein, the wiring structures (e.g., wiring layers, interconnect structures, etc.) can include a liner, e.g., TaN and Co, prior to the deposition of the metal material, e.g., copper with a Co cap. In this way, it is possible to have contacts and wiring structures (or interconnect vias) connected in a lateral orientation (tip-to-tip from sides of the contacts) such that the interconnect level for the wiring structures 44a, 44b, 44c and the contacts 36a, 34a, etc. are in the same plane. In addition, the wiring structure 44c between the contacts 34a will be provided in a negative enclosure providing the advantages noted above, e.g., providing improved contact tolerances.

Figure 9:
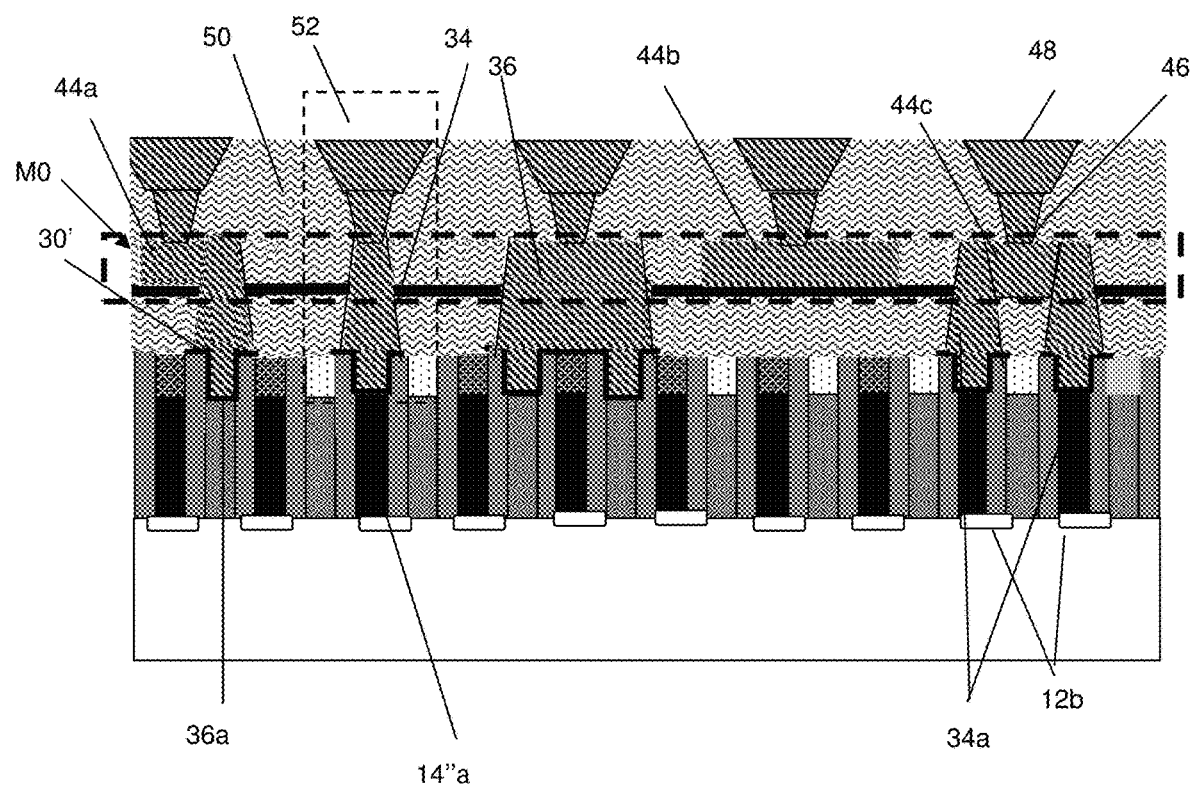
FIG. 9 shows vias and upper metal wiring structures in contact with the re-entrant profile contacts, amongst other features, and respective fabrication processes in accordance with aspects of the present disclosure.

FIG. 9 shows additional structures and respective processes in accordance with aspects of the present disclosure. In particular, FIG. 9 shows via interconnect structures 46 and upper metal wiring structures 48 formed in an interlevel dielectric material 50, in direct contact with the wiring structures 44a, 44b, 44c and the contacts 34, 36. The combination of the contact 34, via interconnect structure 46 and upper metal wiring structure 48 over selected source/drain contact 14"a will form a super via construct 52.

In embodiments, the interlevel dielectric material 50 can be deposited using a conventional deposition process, e.g., CVD and CMP planarization. The via interconnect structure 46 and upper metal wiring structure 48 can be fabricated using well known processes for those skilled in the art, e.g., dual damascene processes. Any residual metal material on the interlevel dielectric material 50 can be removed by a conventional planarization process, e.g., CMP.

FIG. 10 shows different configurations/arrangements/embodiments, where the hardmask 32 is used to transfer the patterns of 14a, 12a and of a metal layer e.g. MO, with the re-entrant profile contacts and airgaps 54, amongst other features, and respective fabrication processes in accordance with additional aspects of the present disclosure. In embodiments, the airgaps 54 can be provided in any of the structures shown and described herein. In particular, the structure 10' of FIG. 10 shows contacts 36a of selected gate structures 12'a and contacts 34a of source/drain contacts 14'a. In this arrangement, the contacts 34a can be formed to bridge source/drain contacts 14'a between one or more gate structures 12, with the capping material 20 of the gate structures 12 providing electrical isolation from the contacts 34a.

As further shown in FIG. 10, the airgaps 54 are formed in interlevel dielectric material 38 between selected gate contacts 36a and a first metal wiring layer 36' and selected source/drain contacts 34a and the first metal wiring layer 36'. In embodiments, the airgaps 54 can be formed during the deposition process of the interlevel dielectric material 38 as a result of a pinch-off phenomenon in smaller spaces, e.g., between the contacts 36a, 34a and the first metal wiring layer 36'. The interlevel dielectric material 38 can also undergo an etch back process to form a planar surface.

Figure 11:
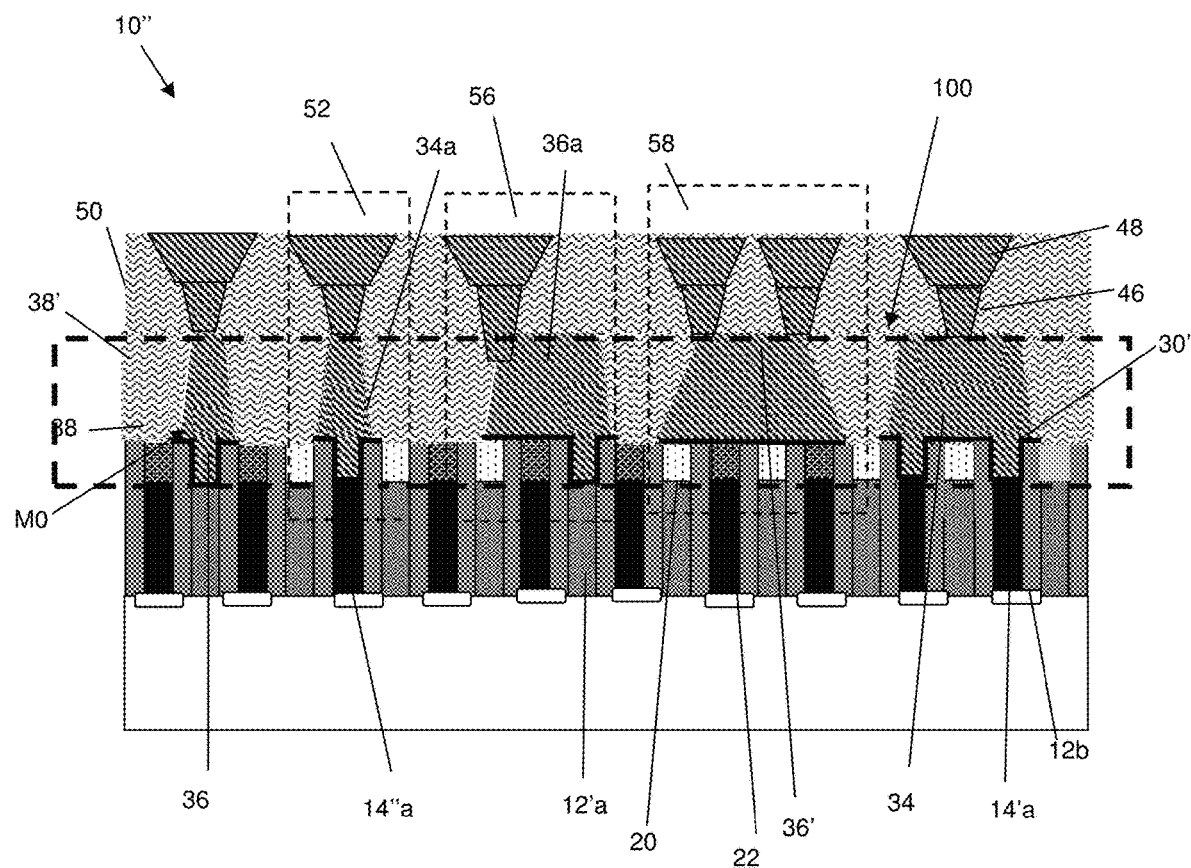
FIG. 11 shows different configurations/arrangements with the re-entrant profile contacts, amongst other features, and respective fabrication processes in accordance with additional aspects of the present disclosure.

FIG. 11 shows different configurations/arrangements with the re-entrant profile contacts, amongst other features, and respective fabrication processes in accordance with additional aspects of the present disclosure. In particular, the structure 10" of FIG. 11 shows contacts 36a of selected gate structures 12'a and contacts 34a of source/drain contacts 14'a, 14"a. In this arrangement, it should be recognized that the contacts 34a, 36a will be on a same plane and, when the metallization is not connected to the source/drain or gate metallization, can comprise a first wiring layer MO, e.g., wiring structure 36'. The wiring structure 36' with the contacts 34a, 36a can also be formed using a single metallization process as already described herein. The wiring structure 36', though, can be separated from the source/drain and the gate metallization by the respective capping material 20, 22 over these respective structures.

In embodiments, the via interconnect structures 46 and upper metal wiring structures 48 are formed in an interlevel dielectric material 50, in direct contact with the contacts 34, 34a, 36, 36a and wiring layer 36'. The combination of the contact 34a, via interconnect structure 46 and upper metal wiring structure 48 over selected source/drain contact 14"a will form a super via construct 52. In addition, the combination of the contact 36a for the selected gate structure 12'a, the via interconnect structure 46 and upper metal wiring structures 48 will form a local interconnect structure 56. Similarly, the combination of the wiring structure 36' and the pair of via interconnect structures 46 and upper metal wiring structures 48 will form a local interconnect structure 58. It should be further noted that structures 34 and 36a enable the ability to make connections respectively to source/drain contacts and gate contacts, without shorting respectively to gate contacts and source/drain contacts. Similarly, structure 36' enables an internal wiring level without shorting to gate or source/drain contacts, which is not intended to be an exhaustive description of constructs (similar to FIG. 9).

In FIG. 11, it should be recognized that, as shown in dashed box 100, the contacts 34, 34a, 36, 36a and wiring layer 36' are now realized with only a single metallization step (at a lower metal layer, e.g., metal layer MO). Also, as noted with respect to FIG. 4, above, the processes herein, e.g., using a blanket deposition process, there will only be a liner or barrier 30' at the bottom of the features, e.g., contacts 34, 34a, 36, 36a and wiring layer 36', thereby suppress all interfaces (liner and barrier from contacts to metal lines in upper features or sidewalls). Moreover, in the processes described herein, there is no interlevel dielectric material or ultra-low k dielectric material under the wiring structures of the first metallization layer, e.g., depicted by dashed box 100. Also, the gate contacts, the source/drain contacts and the wiring structures, e.g., contacts 34, 34a, 36, 36a and wiring layer 36', on the first level are merged together in a single construct.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming a plurality of gate structures each of which comprise source/drain regions;
    forming a plurality of source/drain contacts in electrical connection with the source/drain regions of the plurality of gate structures;
    forming, with a single metallization, a set of contact structures with a re-entrant profile in electrical connection with selected source/drain contacts of the plurality of source/drain contacts and the selected gate structures of the plurality of gate structures; and
    forming metal wiring features in electrical connection with sidewalls of additional re-entrant contact structures, wherein the metal wiring features and the additional re-entrant contact structures are formed on a same wiring level in a tip-to-tip connection in a lateral orientation.

2. The method of claim 1, further comprising forming spacers which separate each of the plurality of gate structures from each of the plurality of source/drain contacts.

3. The method of claim 2, wherein the forming of the set of contact structures comprises:
    forming a first contact structure with a re-entrant profile and a stepped profile overhanging the spacers on opposing sides of a source drain/contact of the plurality of source/drain contacts, the first contact structure being in electrical connection with the source/drain contact;
    forming a second contact structure with a re-entrant profile and a stepped profile overhanging the spacers on opposing sides of at least one gate structure of the plurality of gate structures, the second contact being in electrical connection with the at least one gate structure; and
    forming additional contact structures in electrical contact with selected source/drain contacts and additional gate structures of the plurality of gate structures, the additional contact structures having a reverse tapered profile and at least one of the additional contact structures being in electrical connection with two of the additional gate structures while also spanning over a source/drain contact between the two additional gate structures.

4. The method of claim 3, wherein the re-entrant profile is a reverse tapered profile, with a larger cross-sectional portion extending into a straight profile between the spacers and a smaller cross-sectional portion at a top portion thereof.

5. The method of claim 3, further comprising forming capping materials provided on a top of remaining source/drain contacts and the gate structures, the capping materials are formed directly on a top surface of the source/drain contact between the two additional gate structures.

6. A method comprising:
    forming a plurality of gate structures each of which comprise-source/drain regions;
    forming a plurality of source/drain contacts in electrical connection with the source/drain regions of the plurality of gate structures;
    forming, with a single metallization, a set of contact structures with a re-entrant profile in electrical connection with selected source/drain contacts of the plurality of source/drain contacts and the selected gate structures of the plurality of gate structures; and
    forming metal wiring features at a same plane as the set of contact structures, wherein the metal wiring features are at a first wiring layer and are formed to be electrically isolated from the additional gate structures and the source/drain contacts by respective capping material.

7. The method of claim 6, wherein the metal wiring features and the plurality of contacts are merged into single construct formed of a single layer.

8. The method of claim 1, wherein the metal wiring features are in an enclosure between contact structures in electrical connection with the source/drain contacts.

9. The method of claim 3, further comprising forming airgaps between contact structures.

10. The method of claim 1, wherein at least one contact structure and an additional via contact and wiring structure form a via in contact with at least one of source/drain contact or a gate contact.

11. A method comprising:
    forming a plurality of gate structures each of which are composed source/drain regions;
    forming a plurality of source/drain contacts in electrical connection with the source/drain regions of the plurality of gate structures;
    forming a first set of contact structures with a re-entrant profile in electrical connection with certain source/drain contacts of the plurality of source source/drain contacts and an overhang that overlaps onto spacers on opposing sides of the certain source/drain contacts;
    forming a second set of contact structures with a re-entrant profile in electrical connection with the certain gate structures of the plurality of gate structures and an overhang that overlaps onto spacers on opposing sides of the certain gate structures;
    forming metal wiring features in electrical connection with sidewalls of ones of the first set and second set of the plurality of contact structures; and
    forming an additional contact structure with a reverse tapered profile spanning over a source/drain contact of the plurality of source/drain structures and in electrical connection with two of the plurality of gate structures.

12. The method of claim 11, wherein the metal wiring features and the ones of the first set and the second set of the plurality of contact structures are formed on a same wiring plane in a tip-to-tip connection in a lateral orientation.

13. The method of claim 11, wherein the first set and second set of the plurality of contact structures are self-aligned direct pattern contacts.

14. The method of claim 11, wherein the first set and second set of the plurality of contact structures are formed from a single metallized feature for the electrical connection with the certain source/drain contacts and the certain gate structures.

15. The method of claim 11, wherein at least one of the metal wiring features is in an enclosure between certain contact structures of the first set of contact structures, wherein the metal wiring is metallized together with the first and second set of contacts.

16. The method of claim 11, wherein the re-entrant profile is a reverse tapered profile, with a larger cross-sectional portion extending into a straight profile between the spacers.

17. The method of claim 16, further comprising forming capping material on the source/drain contacts and gate structures which do not have an electrical connection to the first set of contact structures and the second set of contact structures wherein the capping material provides electrical isolation from the first set of contact structures and the second set of contact structures.

18. The method of claim 11, wherein the contact structure and an additional via contact and wiring structure form a via in contact with the source/drain contact or a gate contact.

19. The method of claim 11, further comprising:
   forming a capping material directly on a top surface of the source/drain contact of the plurality of source/drain structures to electrically isolate the source/drain contact of the plurality of source/drain structures from the additional contact structure; and
   forming a wiring which is in electrical connection and directly contacts two of the plurality of source/drain contacts, the wiring and the two of the plurality of source/drain contacts are in a same wiring plane in a tip-to-tip connection in a lateral orientation.

* * * * *